United States Patent [19]

Grodzinski et al.

[11] Patent Number: 5,661,075
[45] Date of Patent: Aug. 26, 1997

[54] METHOD OF MAKING A VCSEL WITH PASSIVATION

[75] Inventors: Piotr Grodzinski, Chandler; Michael S. Lebby, Apache Junction, both of Ariz.

[73] Assignee: Motorola, Schaumburg, Ill.

[21] Appl. No.: 384,054

[22] Filed: Feb. 6, 1995

[51] Int. Cl.$^6$ .................................................. H01L 21/20
[52] U.S. Cl. ..................... 438/32; 438/38; 438/41
[58] Field of Search .................................. 437/133, 129, 437/105

[56] References Cited

U.S. PATENT DOCUMENTS

| | | | |
|---|---|---|---|
| 5,314,838 | 5/1994 | Cho et al. ............................ | 437/105 |
| 5,316,968 | 5/1994 | Choquette ............................ | 437/105 |
| 5,348,912 | 9/1994 | Choquette et al. .................. | 437/133 |
| 5,468,656 | 11/1995 | Sheith et al. ........................ | 437/23 |
| 5,478,774 | 12/1995 | Ackley et al. ...................... | 437/129 |
| 5,482,891 | 1/1996 | Shieh et al. ........................ | 437/129 |

*Primary Examiner*—Charles L. Bowers, Jr.
*Assistant Examiner*—Ramamohan Rao Paladugu
*Attorney, Agent, or Firm*—Gary F. Witting; Eugene A. Parsons

[57] ABSTRACT

A substrate (103) having a first stack of DBRs (106), an active region (118), and a second stack of DBRs (138) is provided. An etch mask (146) is formed on the second stack of DBRs (138) and etched. The second stack of DBRs (138), the active region (118), and a portion of the first stack of DBRs (106) are subsequently etched. A portion of the etch mask (146) is removed from the etch mask (146). A material layer (202, 302) is then selectively deposited on portions of the second stack of DBRs (138), the active region (118), and the first stack of DBRs (106) by either selective epitaxial over-growth or mass-transfer processes, thereby passivating the VCSEL (101).

16 Claims, 4 Drawing Sheets

5,661,075

METHOD OF MAKING A VCSEL WITH PASSIVATION

BACKGROUND OF THE DISCLOSURE

This invention relates, in general, to optoelectronic devices and, in particular, semiconductor lasers.

BACKGROUND OF THE INVENTION

Presently, vertical cavity surface emitting lasers (VCSELs) are becoming increasingly interesting due to their small size and ease of packaging. However, VCSELs have several problems, such as manufacturing complexity, manufacturing cost, as well as life-time reliability, and the like.

While VCSELs have advantages for certain applications over Fabre Perot or edge emitting lasers, edge emitting lasers are conventionally used because of their commercial availability. However, edge emitting lasers also are not only expensive but difficult to manufacture. In addition, edge emitting lasers have a finite life-time depending on the method of manufacture. For example, an edge emitting laser having a buried heterostructure and utilizing cleaved facets to obtain parallel mirrors expose the parallel mirrors to the atmosphere. By exposing the parallel mirrors or facets to the atmosphere, performance of the laser is degraded. As a result of performance degradation, the mirrors of facets of the laser have been encapsulated or coated in an attempt to improve performance. However, coating of the edge emitting laser has resulted in other problems such as stress which also degrades performance, as well as failure of the edge emitting laser. Additionally, conventional lasers suffer from dark line defects which adversely effect reliability of the lasers.

As can be seen, conventional lasers do not meet requirements that are necessary for high volume manufacturing and cost effectiveness. Further, conventional lasers have life reliability problems, as well as performance problems. Therefore a VCSEL structure and method of making same that is both highly manufacturable and provides high reliability would be highly desirable.

DETAILED DESCRIPTION OF THE DRAWINGS

Figure 1:
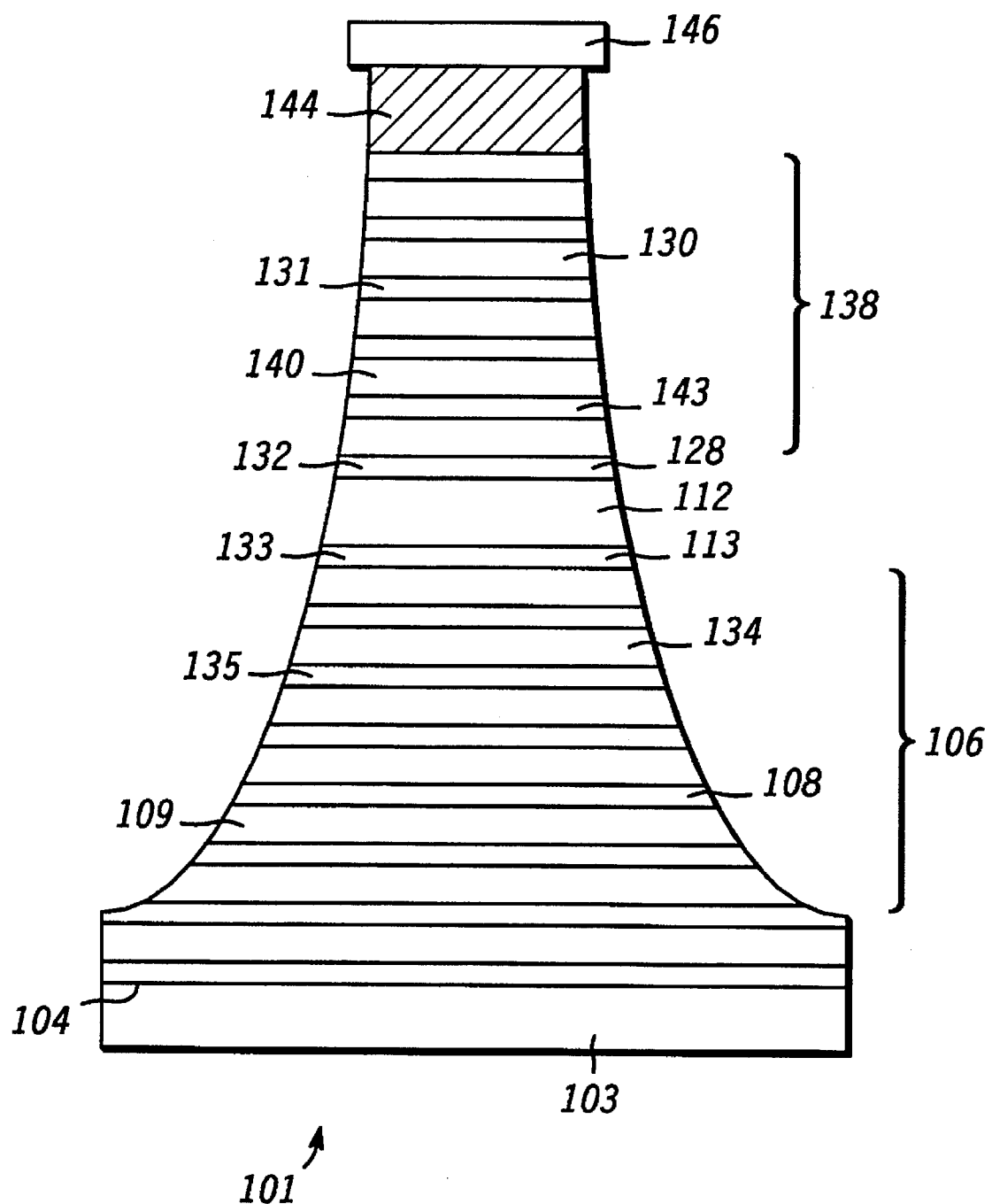
FIG. 1 illustrates a greatly enlarged sectional view of a VCSEL layered structure after etching.

FIG. 1 illustrates an enlarged simplified partially fabricated VCSEL 101. Generally, VCSEL 101 is made of several main elements, such as substrate 103 having surface 104, a stack of distributed Bragg reflectors (DBRs) 106 having alternating layers 108 and 109, a cladding region 113, an active region 112, a cladding region 128, a stack of DBRs 138 having alternating layers 140 and 143, and a contact region 144. It should be understood that FIG. 1 is a sectional view, thus enabling substrate 103 to extend into and out of the drawing, thereby enabling a plurality of vertical cavity surface emitting lasers to be formed on substrate 103.

Typically, VCSEL 101 is prepared by epitaxially growing layers that include the stack of DBRs 106, cladding region 113, active region 118, cladding region 128, the stack of DBRs 138, and contact region 144 on substrate 103. Once substrate 103 has been prepared with aforementioned layers, a masking layer is formed and patterned to form a mask 146. Substrate 103 having the aforementioned layers and mask 146 are subsequently etched which results in partially fabricated VCSEL 101 illustrated in FIG. 1.

More specifically, substrate 103 is made of any suitable material, such as silicon, gallium arsenide, indium phosphide, indium gallium arsenide, or the like. However, in a preferred embodiment of the present invention, gallium arsenide is used as substrate 103, thereby facilitating the epitaxial growth of the stack of DBRs 106.

The stacks of DBRs 106 and 138, cladding regions 113 and 128, active region 118, and contact region 144 typically is made of any suitable material that is epitaxially deposited, such as gallium arsenide, indium gallium arsenide phosphide, aluminum gallium arsenide, or the like. However, in a preferred embodiment of the present invention, alternating layers 108, 143 and 109, 140 are made of gallium arsenide and indium gallium phosphide, respectively. Further, by making alternating layers 108, 143 and 109, 140 of gallium arsenide and indium gallium phosphide, respectively, use of aluminum gallium arsenide is eliminated. Thus, the susceptibility of VCSEL 101 to surface oxidation is significantly reduced. Additionally, it is believed that since surface oxidation is reduced, reliability of VCSEL 101 is improved.

Typically, the stacks of DBRs 106 and 138, portions of cladding regions 113 and 128, and contact region 144 are doped with any suitable dopant, i.e., an n-type dopant and a p-type dopant. Generally, the stacks of DBRs 106 and portions of cladding region 113 are doped with the n-type dopant, while portions of cladding region 128, the stacks of DBRs 138, and contact region 144 are doped with a p-type dopant.

Once the stacks of DBRs 106 and 138, cladding regions 112 and 128, active region 118, and contact region 144 have been formed on substrate 103, mask 146 is formed on the contact region 144. Generally, mask 146 is formed as a circular dot pattern using conventional photolithography. Mask 146 provides an area that is covered or masked by mask 146, as well as an area that is exposed or unmasked. Mask 146 allows for selective etching of the area exposed or unmasked. Thus, material is removed or etched away from the exposed area, thereby forming a mesa or ridge structure of VCSEL 101 that is partially fabricated.

Mask 146 is made by any suitable material, such as silicon dioxide, oxynitride, nitride, or the like. However, in a preferred embodiment of the present invention, mask 146 is made of a silicon dioxide material.

As can be seen in FIG. 1, etching of the exposed areas results in exposure of several surfaces, illustrated by surfaces 130, 131, 132, 133, 134, and 135, vertically aligned with mask 146. Upon completion of the etch process, VCSEL 101 is ready for subsequent processing described hereinbelow.

Figure 2:
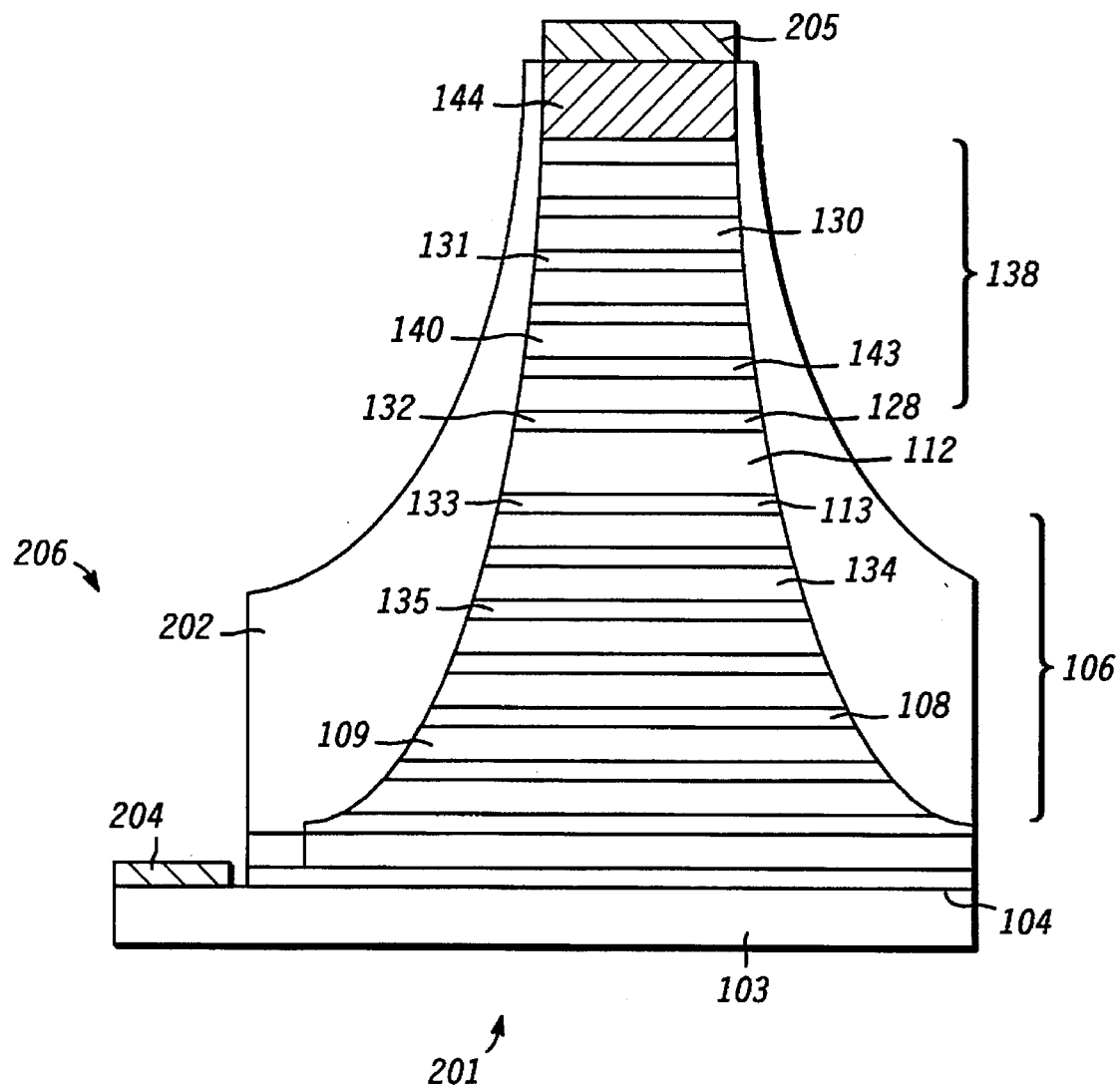
FIG. 2 illustrates a greatly enlarged sectional view of a VCSEL after completion of the fabrication process.

FIG. 2 illustrates a greatly enlarged sectional view of a VCSEL 201 after overgrowth of a layer 202 and electrical coupling. It should be understood that similar features or elements identified in FIG. 1 will retain their same identifying numerals in FIG. 2. VCSEL 201 is shown to further include layer 202, opening 206, and contacts 204 and 205.

After completion of the etch process, as shown in FIG. 1, VCSEL 101 is subjected to a epitaxial over-growth process which forms layer 202 on all exposed surfaces, illustrated by surface 130-135 in FIG. 1. The over-growth process is achieved in any suitable reaction chamber, such as a metal organic chemical vapor deposition (MOCVD) chamber, or the like.

Any suitable vapor phosphorous containing species or material, such as indium gallium phosphide, indium gallium phosphide arsenide, or the like can be used in the reaction chamber to form layer 202. Utilization of the epitaxial over-growth process with InGaP (As) material alloys provide layer 202 that is latticed matched to the GaAs material of VCSEL 201, thereby passivating VCSEL 201.

Since buried-heterostructure or VCSEL 201 undergoes the over-growth process, all post-etched surfaces are passivated by layer 202. Thus, all post-etched surfaces are not exposed to the atmosphere which improves reliability. VCSEL 201 also is characterized by a low threshold current due to low current spreading occurring VCSEL 201 configured into a buried heterostructure. Additionally, elimination of AlGaAs material from VCSEL 201 further improves reliability and reduces dark-line defects. Additionally, by selecting the suitable materials mentioned hereinabove for epitaxial over-growth, layer 202 provides enhanced light confinement for VCSEL 201.

Typically, process parameters for temperature and pressure can range from 500 to 900 degrees Celsius, with a preferred range from 600 to 800 degrees Celsius, and a nominal range from 650 to 750 degrees Celsius, and 10 to 1000 millibarrs, with a preferred range from 50 to 200 millibarrs, and a nominal value of 100 millibarrs. Time is adjusted depending upon a thickness desired.

Once the growth process is complete, substrate 103 is removed from the reaction chamber and the mask 146 is removed. Removal of mask 146 is achieved by any suitable method compatible with the materials used. For example, if mask 146 is made of silicon dioxide, then mask 146 can be removed by hydrofluoric acid or the like.

Electrical contacts, illustrated by contacts 204 and 205 are now formed, thereby electrically connecting VCSEL 201. Electrical contacts 204 and 205 are made by any suitable method or combination of methods well known in the art, such as photolithography, etching, deposition, or the like. For example, opening 206 is formed by any suitable method or combination of methods, such as photolithography, etching, or the like. Opening 206 is then filled or partially filled by any suitable electrically conductive material, such as aluminum to form contact 204. Filling of opening 206 is achieved by well-known methods or by combinations of well-known methods, such as photolithography, evaporation, sputtering, etching, or the like.

Figure 3:
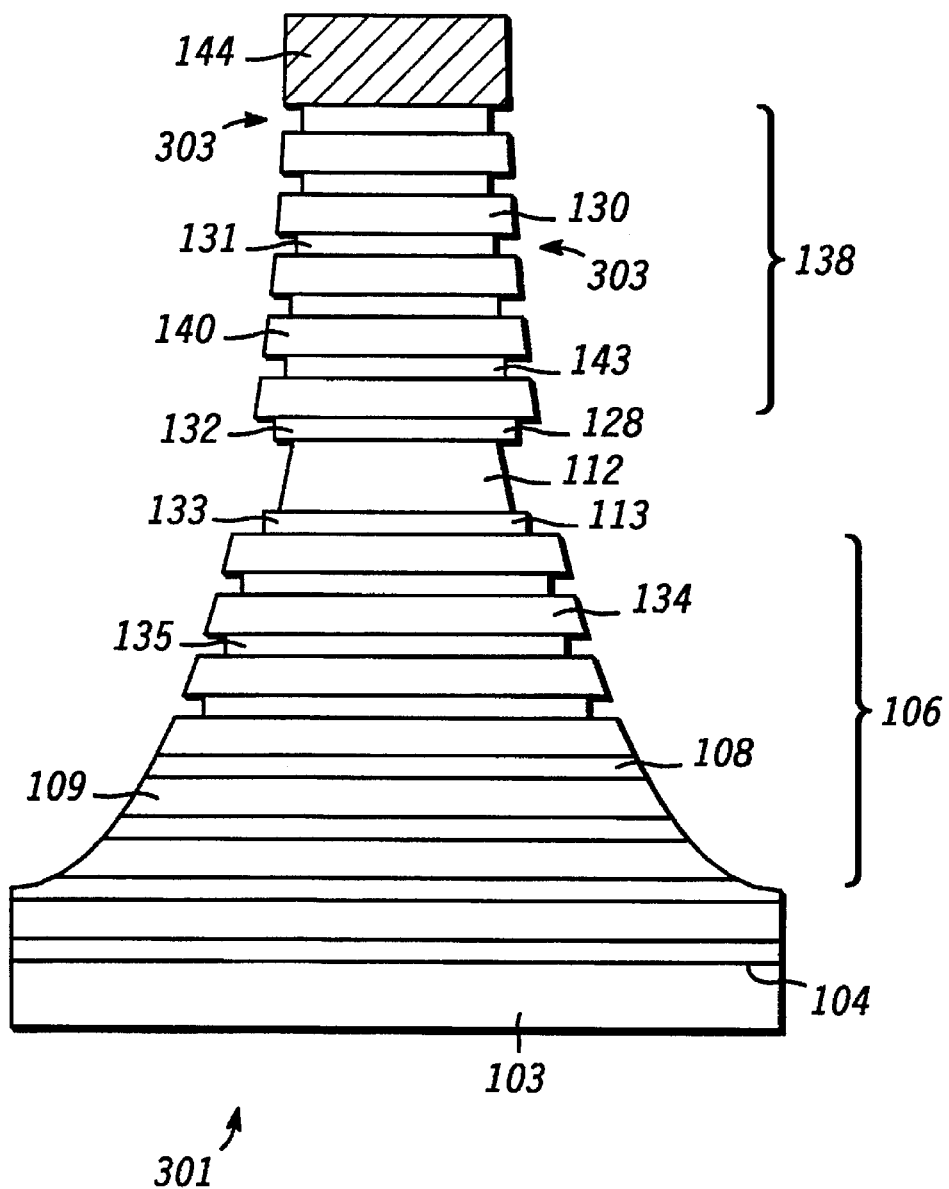
FIG. 3 illustrates another greatly enlarged sectional view of another VCSEL layered structure after etching.

FIG. 3 illustrates another greatly enlarged sectional view of a VCSEL 301 layered structure after etching. VCSEL 301 is similar to VCSEL 101 shown in FIG. 1 except that under-cut surfaces 303 of gallium arsenide material are formed as a result of etching. It should be understood that similar features or elements identified in FIGS. 1 and 2 will retain their same identifying numerals in FIG. 3. VCSEL 301 is shown to further include under-cut surfaces 303.

Etching of VCSEL 301 typically is achieved as described hereinabove with reference to FIG. 1; however, during the etch process or processes under-cut surfaces 303 of VCSEL 301 are generated. Generally, under-cut surfaces 303 are formed as a two step process, wherein VCSEL 301 is first formed similar to VCSEL 101 described hereinabove, and wherein under-cut surfaces 303 are formed in another etching process that selectively etches exposed gallium arsenide. Any suitable etchant, e.g., sulfuric acid/aqueous hydrogen peroxide, or the like, can be used. Generation of under-cut surfaces 303 allows the gallium arsenide to be buried in VCSEL 301 after subsequent processing discussed hereinbelow.

Figure 4:
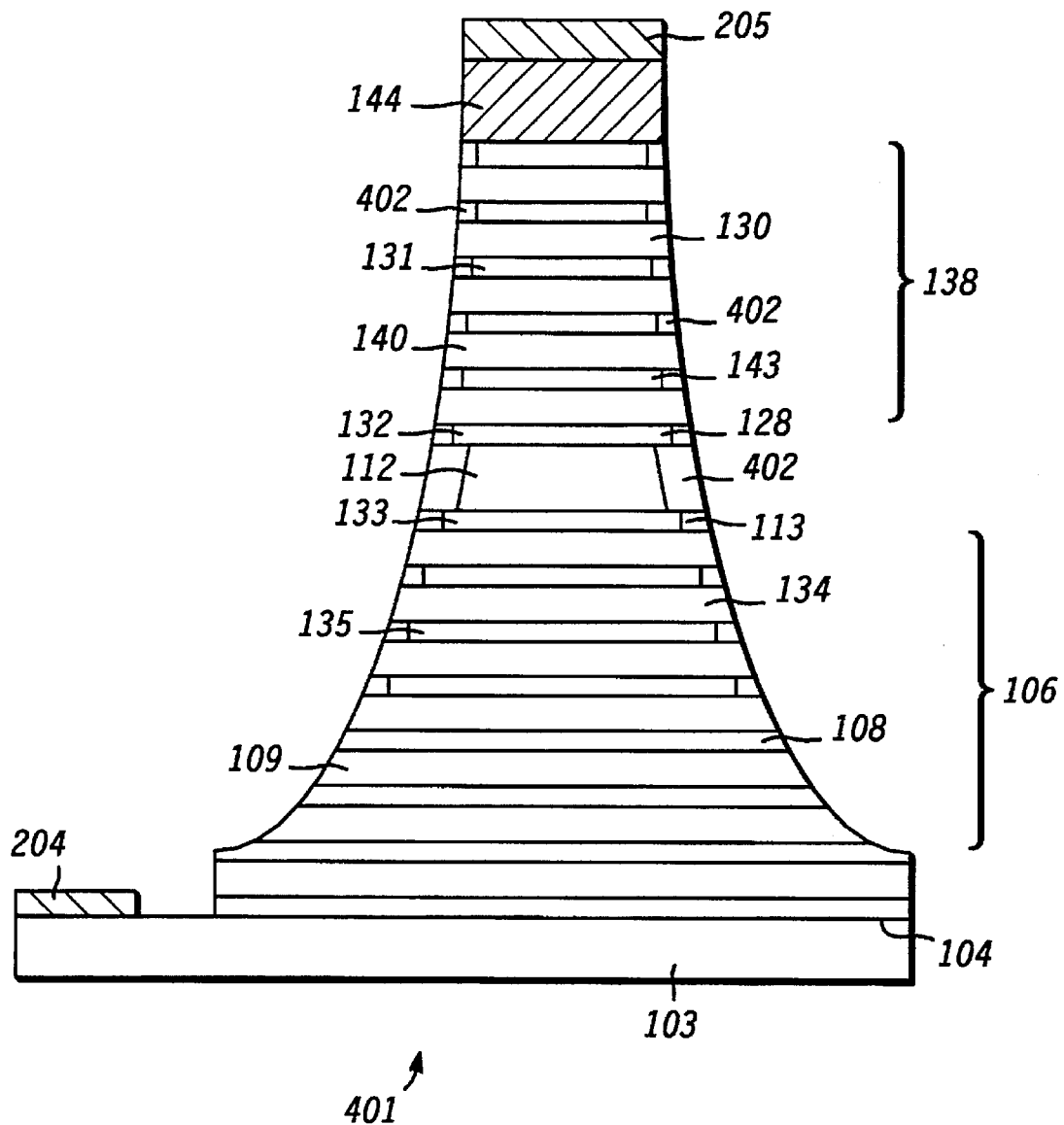
FIG. 4 illustrates another greatly enlarged sectional view of a VCSEL after completion of the fabrication process.

FIG. 4 illustrates a greatly enlarged sectional view of a VCSEL 401 after completion of the fabrication process. Once VCSEL 301 is completed, VCSEL 301 is subjected to a mass-transport process that buries under-cut surfaces 303 in a layer 402. Layer 402 is made of any suitable material that lattice matches with material layers having under-cut 303. By way of example, with under-cuts 303 being made in gallium arsenide layers, VCSEL 301 is placed in a reaction chamber having a temperature, pressure, and with a phosphorus containing species discussed hereinabove. The temperature and the pressure can range as previously described with reference to FIG. 2. Any suitable phosphorus containing species can be used; however, in a preferred embodiment of the present invention, phosphine, tertiarybutylphosphine, or the like is used.

During this process indium gallium phosphide is mass-transported to under-cut surfaces 303 of VCSEL 301 and seals or embeds the gallium arsenide in a layer 402 of indium gallium arsenide. The mass-transport process relies on the migration of already deposited InGaP material. By providing a high enough temperature and a phosphorus rich environment, migration results, thereby transporting InGaP material to under-cut surfaces 303.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

By now it should be appreciated that a novel article and method form making a VCSEL has been provided. Additionally, the VCSEL has improved performance, as well as enhanced life-time reliability. Further, since design and fabrication are simplified, VCSEL is highly manufacturable.

What is claimed is:

1. A method for making a VCSEL comprising the steps of:
providing a substrate having a first stack of DBRs, an active region, and a second stack of DBRs;
forming an etch mask on the second stack of DBRs;
etching the second stack of DBRs, the active region, and a portion of the first stack of DBRs;
removing a portion of the etch mask from the etch mask;
selecting a material to be deposited which lattice matches with portions of the second stack of DBRs, the active region, and a portion of the first stack of DBRs; and
utilizing mass-transport techniques, depositing the material selectively on the portions of the second stack of DBRs, the active region, and the first stack of DBRs, whereby the material lattice matches with the portions of the second stack of DBRs, the active region, and the first stack of DBRs, thereby passivating the VCSEL.

2. A method for making a VCSEL as claimed in claim 1 further including the step of:

forming a first electrical contact and a second electrical contact to the first stack of DBRs and the second stack of DBRs, respectively.

3. A method for making a VCSEL as claimed in claim 2 wherein the step of forming the first electrical contact and the second electrical contact to the first stack of DBRs and the second stack of DBRs further includes the steps of:

removing a portion of the material exposing a portion of the second stack of DBRs; and forming an electrically conductive material on the exposed portion of the second stack of DBRs, thereby making the first electrical contact.

4. A method for making a VCSEL as claimed in claim 1 where, in the removing of the portion of the etch mask from the etch mask, the portion is removed by a lift-off process.

5. A method for making a VCSEL as claimed in claim 1 where, in forming the etch mask on the second stack of DBRs, the etch mask is formed by including a dielectric material and an organic material.

6. A method for making a VCSEL as claimed in claim 1 where, in the depositing of the material on a portion of the second stack of DBRs, the active region, and the first stack of DBRs, the depositing of the material is achieved by depositing a dielectric.

7. A method for making a VCSEL as claimed in claim 1 where, in the depositing of the material on a portion of the second stack of DBRs, the active region, and the first stack of DBRs, the depositing of the material is achieved by depositing a semiconductor.

8. A method for making a VCSEL comprising the steps of:

providing a substrate having a first stack of DBRs, an active region, and a second stack of DBRs;

forming an etch mask on the second stack of DBRs;

etching the second stack of DBRs, the active region, and a portion of the first stack of DBRs, wherein the etching of the first stack of DBRs, the active region, and the second stack of DBRs exposes surfaces of the first stack of DBRs, the active region, and the second stack of DBRs;

removing a portion of the etch mask from the second stack of DBRs;

selecting a semiconductor material to be deposited which lattice matches with the exposed surfaces of the first stack of DBRs, the active region, and the second stack of DBRs; and utilizing mass-transport techniques, depositing the semiconductor material selectively on the exposed surfaces of the second stack of DBRs, the active region, and the first stack of DBRs, whereby the material lattice matches with the exposed surfaces of the second stack of DBRs, the active region, and the first stack of DBRs, thereby selectively passivating the VCSEL with a semiconductor material.

9. A method for making a VCSEL as claimed in claim 8 further including the step of:

forming a first electrical contact and a second electrical contact to the first stack of DBRs and the second stack of DBRs, respectively.

10. A method for making a VCSEL as claimed in claim 9 where, in the step of forming the first electrical contact and the second electrical contact to the first stack of DBRs and the second stack of DBRs further includes the steps of:

removing a portion of the semiconductor material, thereby exposing a portion of the second stack of DBRs; and forming an electrically conductive material in the exposed portion of the second stack of DBRs, thereby making the first electrical contact.

11. A method for making a VCSEL as claimed in claim 8 where, in the removing of the portion of the etch mask from the etch mask, the portion is removed by a lift-off process.

12. A method for making a VCSEL as claimed in claim 8 where, in forming the etch mask on the second stack of DBRs, the etch mask is formed by including a dielectric material and an organic material.

13. A method for making a VCSEL comprising the steps of:

providing a substrate having a first stack of DBRs, an active region, a second stack of DBRs, and a contact region;

forming an etch mask on the contact region;

etching the contact region, the second stack of DBRs, the active region, and a portion of the first stack of DBRs, wherein the etching of the first stack of DBRs, the active region, and the second stack of DBRs expose surfaces of the contact region, the second stack of DBRs, the active region, the first stack of DBRs;

removing a portion of the etch mask from the contact region;

selecting a material to be deposited which lattice matches with the exposed surfaces of the contact region, the second stack of DBRs, the active region, and the first stack of DBRs; and utilizing mass-transport techniques, depositing a semiconductor material selectively on the exposed surfaces of the contact region, the second stack of DBRs, the active region, and the first stack of DBRs, whereby the material lattice matches with the exposed surfaces of the second stack of DBRs, the active region, and the first stack of DBRs, thereby passivating the VCSEL.

14. A method for making a VCSEL comprising the steps of:

providing a substrate having a first stack of DBRs, an active region, and a second stack of DBRs;

forming an etch mask on the second stack of DBRs;

etching the second stack of DBRs, the active region, and a portion of the first stack of DBRs, wherein the etching of the first stack of DBRs, the active region, and the second stack of DBRs exposes surfaces of the first stack of DBRs, the active region, and the second stack of DBRs, and wherein the first stack of DBRs is larger than the second stack of DBRs;

removing a portion of the etch mask from the second stack of DBRs;

selecting a material to be deposited which lattice matches with the exposed surfaces of the first stack of DBRs, the active region, and the second stack of DBRs; and utilizing mass-transport techniques, depositing a semiconductor material selectively on the exposed surfaces of the second stack of DBRs, the active region, and the first stack of DBRs, whereby the semiconductor material lattice matches with the exposed surfaces of the second stack of DBRs, the active region, and the first stack of DBRs, thereby selectively passivating the VCSEL with a semiconductor material.

15. A method for making a VCSEL as claimed in claim 14 where, in the step of depositing a semiconductor material selectively on exposed surfaces of the second stack of DBRs, the active region, and the first stack of DBRs, the depositing of the semiconductor material is achieved by mass transport.

16. A method for making a VCSEL comprising the steps of:

providing a substrate having a first stack of DBRs, an active region, and a second stack of DBRs;

forming an etch mask on the second stack of DBRs;

etching the second stack of DBRs, the active region, and a portion of the first stack of DBRs;

removing a portion of the etch mask from the etch mask;

selecting a material to be deposited which lattice matches with the second stack of DBRs, the active region, and the portion of the first stack of DBRs; and utilizing mass-transport techniques, mass-transporting the material on portions of the second stack of DBRs, the active region, and the first stack of DBRs, whereby the material lattice matches with the portions of the second stack of DBRs, the active region, and the first stack of DBRs, thereby passivating the VCSEL.

* * * * *